United States Patent
Sharma

(10) Patent No.: US 9,799,828 B1
(45) Date of Patent: Oct. 24, 2017

(54) TOPOLOGICAL INSULATOR INFRARED PSEUDO-BOLOMETER WITH POLARIZATION SENSITIVITY

(71) Applicant: Sandia Corporation, Albuquerque, NM (US)

(72) Inventor: Peter Anand Sharma, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/284,102

(22) Filed: Oct. 3, 2016

Related U.S. Application Data

(60) Provisional application No. 62/258,727, filed on Nov. 23, 2015.

(51) Int. Cl.
*H01L 49/00* (2006.01)
*H01L 31/113* (2006.01)
*H01L 31/032* (2006.01)
*H01L 31/0352* (2006.01)

(52) U.S. Cl.
CPC .......... *H01L 49/003* (2013.01); *H01L 31/032* (2013.01); *H01L 31/035281* (2013.01); *H01L 31/1136* (2013.01)

(58) Field of Classification Search
CPC .................. H01L 49/003; H01L 31/032; H01L 31/035281; H01L 31/1136
See application file for complete search history.

(56) References Cited

U.S. PATENT DOCUMENTS

| 2012/0138887 A1* | 6/2012 | Zhang | H01F 1/401 257/9 |
| 2012/0273763 A1* | 11/2012 | Banerjee | H01L 49/003 257/39 |

OTHER PUBLICATIONS

Unpublished U.S. Appl. No. 15/177,215, filed Jun. 8, 2016, Sandia Corporation, Applicant.
Culcer, D. et al., "Two-Dimensional Surface Charge Transport in Topological Insulators", Physical Review B, 2010, 155457, vol. 82, pp. 155457-1-155457-17.
Ando, Y, "Topological Insulator Materials", Journal of the Physical Society of Japan, 2013, 102001, vol. 82, pp. 102001-1-102001-32.
Wang, Y. H. et al., "Observation of Floquet-Bloch States on the Surface of a Topological Insulator", Science, 2013, vol. 342, pp. 453-457.

(Continued)

*Primary Examiner* — Laura Menz
*Assistant Examiner* — Candice Y Chan
(74) *Attorney, Agent, or Firm* — Kevin W. Bieg

(57) ABSTRACT

Topological insulators can be utilized in a new type of infrared photodetector that is intrinsically sensitive to the polarization of incident light and static magnetic fields. The detector isolates single topological insulator surfaces and allows light collection and exposure to static magnetic fields. The wavelength range of interest is between 750 nm and about 100 microns. This detector eliminates the need for external polarization selective optics. Polarization sensitive infrared photodetectors are useful for optoelectronics applications, such as light detection in environments with low visibility in the visible wavelength regime.

10 Claims, 3 Drawing Sheets

(56) References Cited

OTHER PUBLICATIONS

McIver, J. W. et al., "Control Over Topological Insulator Photocurrents with Light Polarization", Nature Nanotechnology, 2012, vol. 7. pp. 96-100.
Rogalski, A. et al., "Infrared Detectors: Status and Trends", Progress in Quantum Electronics, 2003, vol. 27, pp. 59-210.
Van Der Laan, J. D. et al., "Detection Range Enhancement Using Circularly Polarized Light in Scattering Environments for Infrared Wavelengths", Applied Optics, 2015, vol. 54, pp. 2266-2274.

* cited by examiner

TOPOLOGICAL INSULATOR INFRARED PSEUDO-BOLOMETER WITH POLARIZATION SENSITIVITY

CROSS-REFERENCE TO RELATED APPLICATION

This application claims the benefit of U.S. Provisional Application No. 62/258,727, filed Nov. 23, 2015, which is incorporated herein by reference.

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to infrared photodetectors and, in particular, to a topological insulator infrared pseudo-bolometer with polarization sensitivity.

BACKGROUND OF THE INVENTION

A topological insulator is a type of insulating material with conducting surface states, meaning that electrons can only move along the surface of the material. Carriers in these surface states have a spin oriented perpendicular to their velocity. Therefore, spin-up electrons travel in one direction and spin-down electrons travel in the opposite direction. The spin orientation is caused by the spin-orbit interaction. Topological insulator behavior has been observed in compounds with heavy elements having strong spin-orbit coupling, such as antimony, bismuth antimonide, bismuth selenide, bismuth telluride, antimony telluride, and bismuth antimony telluride selenide, among other compounds.

Topological insulators possess spin polarized carrier transport at their surfaces with a spin density proportional to the current density. See Dimitrie Culcer et al., *Physical Review* B 82(15), 155457 (2010). Therefore, devices with tunable control of spin polarized currents might be realized, which would be useful for spintronics applications. See Dmytro Pesin and Allan H. MacDonald, *Nat Mater* 11(5), 409 (2012). In particular, the spin polarized properties of topological insulator surface currents may enable new detection mechanisms useful in photoconductive devices.

SUMMARY OF THE INVENTION

The present invention is directed to a new type of photoconductive infrared detector made using a topological insulator. This invention uses two unique features as a means of detecting light: first, the resistance of the topological insulator surface state changes with incoming polarized light, and second, the spectral sensitivity can be tuned by a static magnetic field. The incident polarized light creates a bandgap in the topological insulator surface state spectrum, increasing the resistance. This detector is similar to a conventional bolometer, except that changes in resistance are not caused by thermal energy, but by the polarization properties of incident light to be detected. An applied magnetic field can be used to control the surface state band gap, which in turn controls the wavelength sensitivity of the detector. As examples of the invention, photodetector embodiments are described below for efficiently detecting incident light in these materials. These detectors allow polarized infrared light detection without the use of polarizers, analyzers, or other intervening polarization optics such as quarter wave plates. Topological insulator materials useful for this device can comprise bismuth, antimony, or bismuth antimonide, or a bismuth chalcogenide or an antimony chalcogenide, such as bismuth selenide, bismuth telluride, antimony telluride, or bismuth antimony tellurium selenide. Further, the list of known topological insulators is increasing. Any such material is expected to be useful as an infrared photodetector in the manner described here. See Y. Ando, *J. Phys. Soc. Japan* 82, 102001 (2013), which is incorporated herein by reference.

BRIEF DESCRIPTION OF THE DRAWINGS

The detailed description will refer to the following drawings, wherein like elements are referred to by like numbers.

DETAILED DESCRIPTION OF THE INVENTION

Figure 1A:
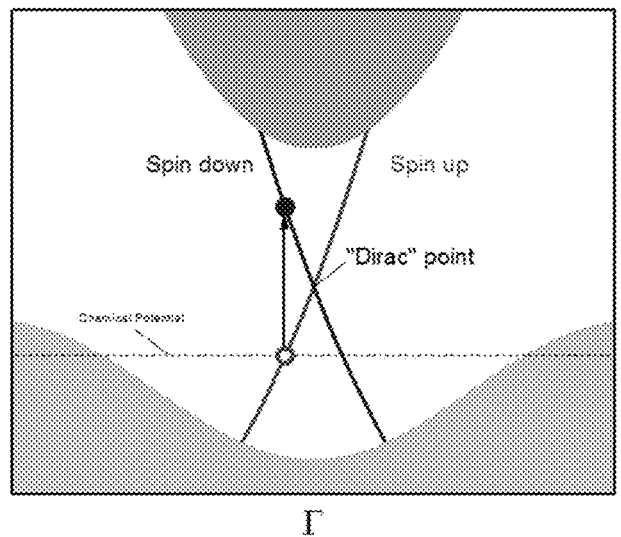
FIGS. 1(a) and 1(b) are schematic illustrations of the change in band structure with the introduction of polarized light in a topological insulator, describing the principle of operation of a photoconductive detector based on topological insulators with incident polarized light.

At zero magnetic field, the surfaces of a topological insulator have opposite spin polarizations. When a magnetic field is applied to a topological insulator, these two spin polarizations no longer coexist and a small band gap forms in the surface state spectrum with a magnitude dependent upon the magnetic field. This effect occurs because a magnetic field breaks time reversal symmetry. Polarized light carries angular momentum and so also breaks time reversal symmetry and influences a topological insulator surface state in an analogous way as a magnetic field. See Y. H. Wang et al., *Science* 342(6157), 453 (2013). The photocurrent from a topological insulator appears to change depending on incident polarization, providing evidence of this mechanism. See McIver, *Nature Nanotechnology* 7, 96 (2012).

The surface states of topological insulators have no band gap in the absence of incident radiation or magnetic fields. The sensitivity of topological insulators to polarized light and magnetic fields can be used to provide a new type of infrared photodetector according to the present invention. Since a band gap can be generated in the topological insulator surface states with exposure to polarized incident light, the resistance of the surface state increases accordingly. No other material appears to be intrinsically sensitive to the polarization of incident light in this way. A static magnetic field has the same effect upon the topological insulator surface state as polarized light. Therefore, the size of the band gap generated in the surface states can be tuned depending on incident light polarization and intensity, and the magnitude of the static magnetic field. The size of this band gap can be very small, making this phenomenon useful for infrared photodetection. The bulk band gap of topological insulators sets the lower limit for infrared detection wavelength, and is typically 0.1-0.3 eV, so that wavelengths greater than 750 nm are expected to be the wavelengths of interest for topological insulator infrared photodetectors. A useful upper wavelength limit is probably near 100 microns, which is on the scale of the dimensions of the exemplary device, meaning that longer wavelengths will lose light collection efficiency.

Infrared photodetectors have a wide range of applications. See Antoni Rogalski, *Prog. Quantum Elec.* 27, 59 (2003). The ability to detect the polarization of incoming radiation is particularly useful in imaging or detection applications where the visibility is low (such as a fog or dust environment) in the visible wavelength regime. Polarized infrared light is known to penetrate further, enhancing detection range, in high scattering environments. See J. D. van der Laan et al. *Applied Optics* 54, 2266 (2015). Other infrared detection materials, such as HgCdTe, are not intrinsically sensitive to polarization and so additional intervening optics must be added to a detector system for polarization detection with these materials. The ability to eliminate polarization optics with the present invention leads to the improvement in size, weight, and power characteristics and lower reflection losses. It is also possible to make a higher density of pixels in infrared imaging systems without the need to incorporate polarization optics, such as wire grid polarizers.

Figure 1B:
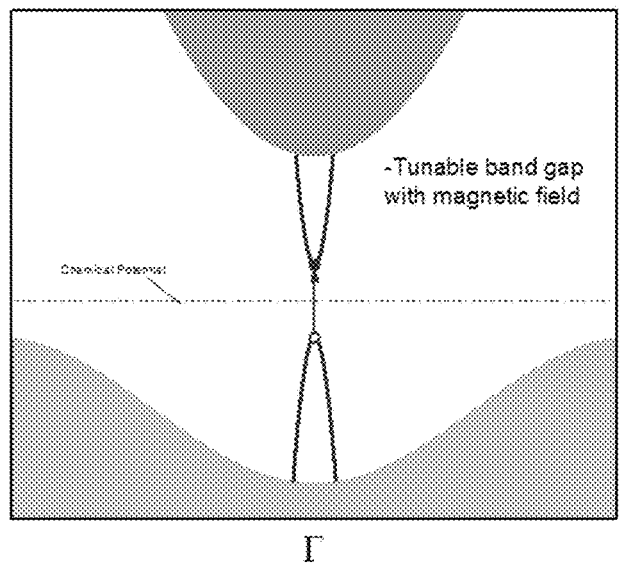

The mechanism for detection of infrared light is described by FIGS. 1(*a*) and 1(*b*), which show the band diagram of a prototypical topological insulator in zero magnetic field with and without exposure to light. The x-axis of this plot refers to the k vector of electrons in the band structure. As shown in FIG. 1(*a*), spin up and spin down surface bands occur in the middle of the band gap. The surface bands intersect at a "Dirac" point located inside the bulk band gap. If light impinges upon this material, an excitation from spin up to spin down can occur if the light has the correct type of polarization. FIG. 1(*b*) shows a schematic of the observed physical response of a topological insulator to infrared light. See Y. H. Wang et al., *Science* 342(6157), 453 (2013). The spin up and spin down bands of FIG. 1(*a*) collapse if the light is circularly polarized, and a band gap develops, as shown in FIG. 1(*b*). The opening of the band gap will lead to an increase in resistance, which is the basis for the photodetector described herein. A magnetic field has an analogous effect on the band structure. However, in topological insulators, the role of the magnetic field is played by spin-orbit coupling. Typical bulk band gaps of topological insulators are small, for example less than 0.5 eV. The opening of the gap in the surface state spectrum is 10 times or more smaller than the bulk band gap. These band gap magnitudes indicate that changes in material behavior will be in the infrared regime.

Figure 2A:
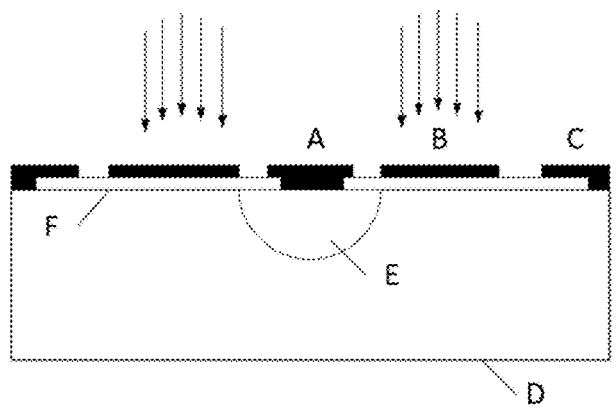
FIG. 2(a) is a side-view schematic of a gated diode photodetector with a Corbino geometry for detection of polarized incoming light.
Figure 2B:
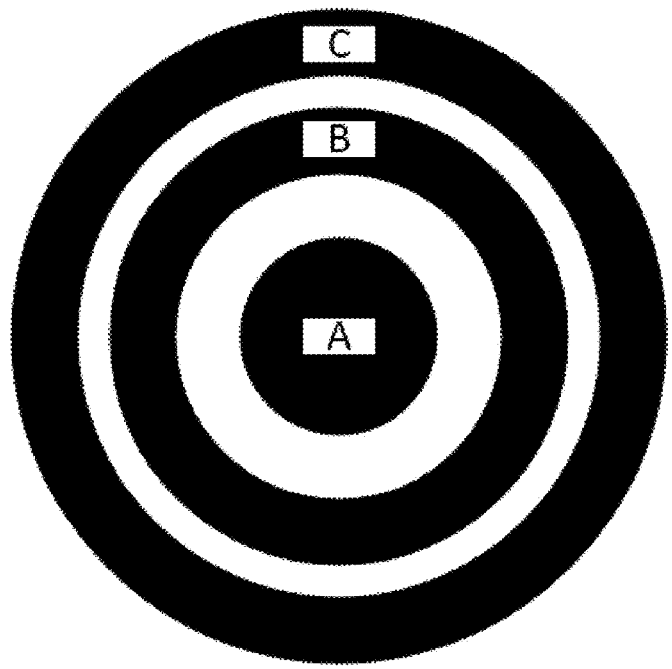
FIG. 2(b) is a top-down schematic of the gated diode photodetector.

The present invention combines the observed spin polarized properties of topological insulators with a specific device design to provide a new means of detection of polarized light. In particular, a diode structure is described with a gate overlapping source and drain contacts. Light incident on the diode will change the source-drain resistance depending upon polarization. The diode can be made out of any topological insulator. An embodiment of this diode uses source and drain contacts that are coaxial, which is used to isolate a single surface for spin transport. A coaxial source and drain contact arrangement is sometimes referred to as a Corbino geometry. In the Corbino geometry, symmetry dictates that the equipotentials are concentric circles in the annular region between the contacts. The source or drain contacts must be selectively doped in an opposite sense to the topological insulator substrate. This feature is needed for device operation because otherwise multiple surfaces will contribute to the change in resistance in different amounts. FIG. 2(*a*) is a schematic illustration of a Corbino p-n junction detector that operates based on above described mechanism. A center circular electrode A makes an Ohmic contact to a selectively doped region E. An outer concentric ring-shaped electrode C makes an Ohmic contact to the substrate. A topological insulator substrate D and doped region E are of different carrier types, i.e. either p and n, or n and p. An annular gate electrode B is separated from the substrate by a dielectric layer F, thereby providing a channel region at the surface of the topological insulator substrate between the source and drain. The source and drain electrodes A and C can be metals, such as Au, Ti, W, or other metal. The gate dielectric F can be alumina oxide or other oxide or insulating material. The substrate D is a topological insulator material, for example, but not limited to, $Bi_2Te_3$. The doped region E can be formed using deposition and annealing or ion implantation. See U.S. patent application Ser. No. 15/177,215, filed Jun. 8, 2016, which is incorporated herein by reference. The direction of incident light is indicated by the arrows. Light can be transmitted through the top layers using electrodes transparent to infrared radiation, such as indium tin oxide. The gate dielectric layer F will be transparent to the wavelengths of interest due to the large band gap. For example, a typical dielectric layer is $Al_2O_3$, which has a band gap of greater than 8 eV. Light impinging upon the surface of the photodetector will change the source-drain resistance in the channel region depending upon the incident polarization. A static magnetic field can be applied perpendicular to the surface of the device (in the same direction as the incident radiation) for tuning the spectral regime of operation. FIG. 2(*b*) shows a top down view of the Corbino p-n junction design, with selected corresponding parts labeled.

Figure 3:
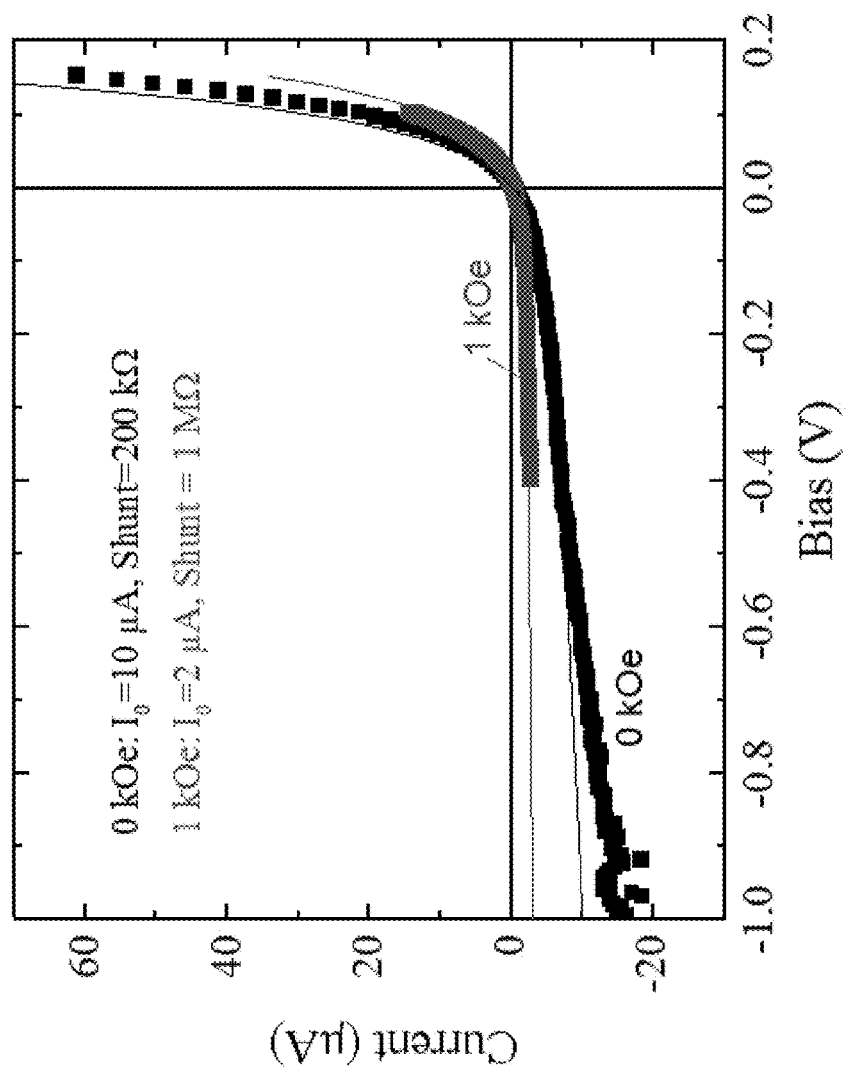
FIG. 3 is a graph of the current-voltage characteristics for a p-n photodetector.

FIG. 3 shows experimental evidence for the existence of a p-n junction as a proof of principle for this device. Current versus voltage (IV) curves were measured for a device with a centrally p-doped region in $Bi_2Se_3$, a standard topological insulator. Ground was defined at the back of the substrate. A rectifying contact was found, expected for a p-n junction. This p-n junction has an exponential turn on near zero bias. At negative bias, the current changed appreciably. This is one indication of a shunt resistance in parallel with the p-n junction. This shunt resistance may be due to the topological insulator surface state. The equation for the current of a p-n junction in the presence of a shunt resistance is:

$$I=I_0(e^{qV/nkT}-1)+V/R_s,$$

where $I_0$ is the reverse bias saturation current, q is the electron charge, k is Boltzmann's constant, T is temperature, V is applied bias, n is the ideality factor, and $R_s$ is the shunt resistance. The ideality factor was fixed at n=2, which described the exponential turn-on well. There were then two free parameters, the shunt resistance and reverse bias saturation current. Simulations were performed to match the observed data in FIG. 3. A series resistance was also considered in this simulation, but it was found that this term was negligible due to the shape of the exponential turn on.

At 300 K and 0 kOe, the experimental data points imply a saturation current of 10 µA and a shunt resistance of 200 kΩ. This p-n junction has a somewhat high leakage current. An obvious origin of shunt resistance and leakage current in the present device is the topological insulator surface state. To check this hypothesis, the field was increased in the out-of-plane direction, which is expected to suppress the surface state. A magnetic field opens a gap in the surface state band structure, resulting in a strongly reduced conduction. A magnetic field parallel to the surface does not lead to an energy gap, but can lead to a modification of the surface state scattering length and a change in resistance. The sidewalls of the substrate were angled, and so a somewhat large field of ~1 kOe was used to ensure a large enough out-of-plane component exists for the sidewalls. The 1 kOe line in FIG. 3 shows the IV curve of the same sample at 300 K. Ideal diode behavior with a shunt resistance was again simulated. A saturation current of 2 µA and a sheet resistance of 1 MΩ were found. Both these values indicate the presence of less parasitic conduction at higher magnetic fields.

The present invention has been described as an infrared photodetector using topological insulator materials. It will be understood that the above description is merely illustrative of the applications of the principles of the present invention, the scope of which is to be determined by the claims viewed in light of the specification. Other variants and modifications of the invention will be apparent to those of skill in the art.

I claim:

1. An infrared photodetector, comprising:
   a topological insulator substrate having conducting surface states,
   a gate dielectric layer disposed on a surface of the topological insulator substrate;
   a gate electrode disposed on the gate dielectric layer, wherein the gate electrode and the gate dielectric layer are transparent to polarized incident light; and
   a source and a drain disposed on the surface of the topological insulator substrate with the gate dielectric layer therebetween, wherein the source or drain are doped oppositely to the topological insulator substrate, thereby forming a p-n junction with a channel region beneath the gate electrode;
   wherein exposure of the p-n junction to polarized incident light generates a band gap in the topological insulator surface states, thereby changing the resistance of the channel region.

2. The photodetector of claim 1, wherein the source or drain are n-type and the substrate is p-type.

3. The photodetector of claim 1, wherein the source or drain are p-type and the substrate is n-type.

4. The photodetector of claim 1, wherein the topological insulator substrate comprises bismuth, antimony, or bismuth antimonide.

5. The photodetector of claim 1, wherein the topological insulator substrate comprises a bismuth chalcogenide or an antimony chalcogenide.

6. The photodetector of claim 5, wherein the topological insulator substrate comprises bismuth selenide, bismuth telluride, antimony telluride, or bismuth antimony tellurium selenide.

7. The photodetector of claim 1, further comprising means to apply a static magnetic field perpendicular to the channel region, thereby modifying the surface state band gap.

8. The photodetector of claim 1, further comprising means to apply a static magnetic field parallel to the channel region, thereby modifying the surface state scattering length.

9. The photodetector of claim 1, wherein the wavelength of the incident light is between 750 nm and 100 microns.

10. The photodetector of claim 1, wherein the source, drain, and gate electrode form a Corbino geometry.

* * * * *